United States Patent
Trojan

(10) Patent No.: US 11,904,431 B2
(45) Date of Patent: Feb. 20, 2024

(54) METHOD AND APPARATUS FOR INSITU ADJUSTMENT OF WAFER SLIP DETECTION DURING WORK PIECE POLISHING

(71) Applicant: Axus Technology, LLC, Chandler, AZ (US)

(72) Inventor: Daniel Ray Trojan, Chandler, AZ (US)

(73) Assignee: Axus Technology, LLC, Chandler, AZ (US)

(*) Notice: Subject to any disclaimer, the term of this patent is extended or adjusted under 35 U.S.C. 154(b) by 68 days.

(21) Appl. No.: 16/942,546

(22) Filed: Jul. 29, 2020

(65) Prior Publication Data

US 2021/0031331 A1 Feb. 4, 2021

Related U.S. Application Data

(60) Provisional application No. 62/882,417, filed on Aug. 2, 2019.

(51) Int. Cl.
*B24B 49/04* (2006.01)
*H01L 21/67* (2006.01)
(Continued)

(52) U.S. Cl.
CPC .......... *B24B 49/04* (2013.01); *H01L 21/3212* (2013.01); *H01L 21/67259* (2013.01); *H01L 21/68721* (2013.01); *H01L 22/12* (2013.01)

(58) Field of Classification Search
CPC .................. B24B 49/04; H01L 21/3212; H01L 21/67259; H01L 21/68721; H01L 22/12; H01L 22/20; H01L 21/67219
(Continued)

(56) References Cited

U.S. PATENT DOCUMENTS

| 6,116,990 A | * | 9/2000 | Sinclair | B24B 41/047 451/259 |
| 6,991,514 B1 | * | 1/2006 | Meloni | B24B 37/013 451/6 |

(Continued)

FOREIGN PATENT DOCUMENTS

JP 2009-094407 A 4/2009

OTHER PUBLICATIONS

European Extended Search Report dated Jul. 17, 2023 for Application No. EP 20849076.3 (8 pgs.).
(Continued)

*Primary Examiner* — Sylvia MacArthur
(74) *Attorney, Agent, or Firm* — Knobbe, Martens, Olson & Bear, LLP

(57) ABSTRACT

A method and apparatus for insitu adjustment of wafer slip detection during work piece polishing are disclosure. In one aspect, a chemical mechanical planarization (CMP) system, includes: a carrier configured to retain a substrate, a platen supporting a polishing pad, and a slip sensor configured to generate a signal indicative of a characteristic of a surface of the polishing pad. The system further includes a processor configured to: receive the signal from the slip sensor, calibrate a steady-state value of the signal when the CMP system is in a steady-state condition, compare the signal received from the slip sensor to the calibrated steady-state value during CMP polishing, and detect wafer slip in response to the signal received from the slip sensor during the CMP polishing differing from the calibrated steady-state value by more than a threshold value.

13 Claims, 7 Drawing Sheets

(51) Int. Cl.
   *H01L 21/321* (2006.01)
   *H01L 21/687* (2006.01)
   *H01L 21/66* (2006.01)

(58) Field of Classification Search
   USPC .......... 156/345.14, 345.15, 345.17; 438/692, 438/693, 694
   See application file for complete search history.

(56) References Cited

U.S. PATENT DOCUMENTS

| | | | |
|---|---|---|---|
| 8,932,883 B2* | 1/2015 | Matsuo | H01L 21/30625 |
| | | | 438/692 |
| 9,240,042 B2* | 1/2016 | Doughty | G01S 17/04 |
| 2003/0134571 A1 | 7/2003 | Cheng et al. | |
| 2005/0105103 A1 | 5/2005 | Schietinger et al. | |
| 2005/0118839 A1* | 6/2005 | Chen | B24B 49/12 |
| | | | 257/E21.244 |
| 2009/0209175 A1 | 8/2009 | Saito et al. | |
| 2016/0082566 A1* | 3/2016 | Doughty | G06T 7/001 |
| | | | 382/151 |
| 2017/0151647 A1* | 6/2017 | Duboust | B24B 37/042 |
| 2017/0173756 A1* | 6/2017 | Yamaki | B24B 37/005 |
| 2018/0311784 A1* | 11/2018 | Trojan | B24B 37/107 |

OTHER PUBLICATIONS

International Search Report and Written Opinion dated Nov. 5, 2020 for Application No. PCT/US2020/044109 (13 pgs.).

* cited by examiner

METHOD AND APPARATUS FOR INSITU ADJUSTMENT OF WAFER SLIP DETECTION DURING WORK PIECE POLISHING

BACKGROUND

Field

The disclosed technology relates to a method and device for improving chemical mechanical planarization (CMP) performance for the planarization of thin films.

Description of the Related Technology

During chemical mechanical planarization or polishing (CMP), an abrasive and either acidic or alkalinic slurry is applied via a metering pump or mass-flow-control regulator system onto a rotating polishing pad/platen. A substrate or wafer is held by a wafer carrier which is rotated and pressed against a polishing pad on a polishing platen for a specified period of time. The slurry is normally brought to the polishing platen in a single-pass distribution system. The wafer is polished (i.e., planarized) by both mechanical means (e.g., abrasion) and chemical means (e.g., corrosion) during the CMP process.

During the CMP process, significant forces are created due to the interplay between the substrate, the wafer carrier, the polishing pad and the polishing platen. A substrate which is not held securely within this interface can slip from its position, which can negatively impact the process. Thus, there is a need to improve the ability to detect such slipping of the substrate during processing, to increase CMP efficiency and reduce the cost of manufacturing.

SUMMARY

One aspect of the disclosed technology is a method for insitu adjustment of wafer slip detection during polishing a wafer. In one aspect, a chemical mechanical planarization (CMP) system, comprises: a carrier configured to retain a substrate; a platen supporting a polishing pad; a slip sensor configured to generate a signal indicative of a characteristic of a surface of the polishing pad; and a processor configured to: receive the signal from the slip sensor, calibrate a steady-state value of the signal when the CMP system is in a steady-state condition, compare the signal received from the slip sensor to the calibrated steady-state value during CMP polishing, and detect wafer slip in response to the signal received from the slip sensor during the CMP polishing differing from the calibrated steady-state value by more than a threshold value.

In certain embodiments, the slip sensor comprises an optical sensor configured to measure a reflectance of the surface of the polishing pad.

In certain embodiments, the processor is further configured to: recalibrate the steady-state value in real-time based on the signal received from the slip sensor during CMP polishing.

In certain embodiments, the processor is further configured to: determine that the CMP system is in the steady-state condition based on at least one of the following: rotation of the platen, rotation of the carrier, a pressure applied to the substrate, a pressure applied to a retaining ring configured to hold the substrate within the carrier, and/or a rate of fluid flow provided onto the polishing pad.

In certain embodiments, the processor is further configured to: stop all motion of components of the CMP system in response to detecting the wafer slip.

In certain embodiments, calibrating the steady-state value comprises: reading the signal from the slip sensor over a set length of time to obtain a set of expected slip sensor values.

In certain embodiments, the set length of time allows the slip sensor to measure each portion of the polishing pad that will be measured by the slip sensor during the CMP polishing.

Another aspect is a method of detecting wafer slip during chemical mechanical planarization (CMP) polishing, comprising: receiving a signal from a slip sensor of a CMP system comprising a polishing pad, the slip sensor configured to generate the signal indicative of a characteristic of a surface of the polishing pad; calibrating a steady-state value of the signal when the CMP system is in a steady-state condition; comparing the signal received from the slip sensor to the calibrated steady-state value during CMP polishing; and detecting wafer slip in response to the signal received from the slip sensor during the CMP polishing differing from the calibrated steady-state value by more than a threshold value.

In certain embodiments, the slip sensor comprises an optical sensor configured to measure a reflectance of the surface of the polishing pad.

In certain embodiments, the method further comprises: recalibrating the steady-state value in real-time based on the signal received from the slip sensor during CMP polishing.

In certain embodiments, the method further comprises: determining that the CMP system is in the steady-state condition based on at least one of the following: rotation of the platen, rotation of the carrier, a pressure applied to the substrate, a pressure applied to a retaining ring configured to hold the substrate within the carrier, and/or a rate of fluid flow provided onto the polishing pad, or any combination thereof.

In certain embodiments, the method further comprises: stopping all motion of components of the CMP system in response to detecting the wafer slip.

In certain embodiments, calibrating the steady-state value comprises: reading the signal from the slip sensor over a set length of time to obtain a set of expected slip sensor values.

In certain embodiments, the set length of time allows the slip sensor to measure each portion of the polishing pad that will be measured by the slip sensor during the CMP polishing.

Yet another aspect is a chemical mechanical planarization (CMP) system, comprising: a carrier configured to retain a substrate; a platen supporting a polishing pad; a slip sensor configured to generate a signal indicative of a characteristic of a surface of the polishing pad; and a processor configured to: receive the signal from the slip sensor, obtain a set of expected sensor values over a set length of time, compare the signal received from the slip sensor to the set of expected sensor values during CMP polishing, and detect wafer slip in response to the signal received from the slip sensor during the CMP polishing differing from the set of expected sensor values by more than a threshold value.

In certain embodiments, the slip sensor comprises an optical sensor configured to measure a reflectance of the surface of the polishing pad.

In certain embodiments, the processor is further configured to: recalibrate the steady-state value in real-time based on the signal received from the slip sensor during CMP polishing.

In certain embodiments, the processor is further configured to: stop all motion of components of the CMP system in response to detecting the wafer slip.

In certain embodiments, the set length of time allows the slip sensor to measure each portion of the polishing pad that will be measured by the slip sensor during the CMP polishing.

BRIEF DESCRIPTION OF THE DRAWINGS

The above, as well as additional objects, features and advantages of the disclosed technology, will be better understood through the following illustrative and non-limiting detailed description of certain embodiments of the disclosed technology, with reference to the appended drawings. In the drawings like reference numerals will be used for like elements unless stated otherwise.

DETAILED DESCRIPTION

Figure 1:
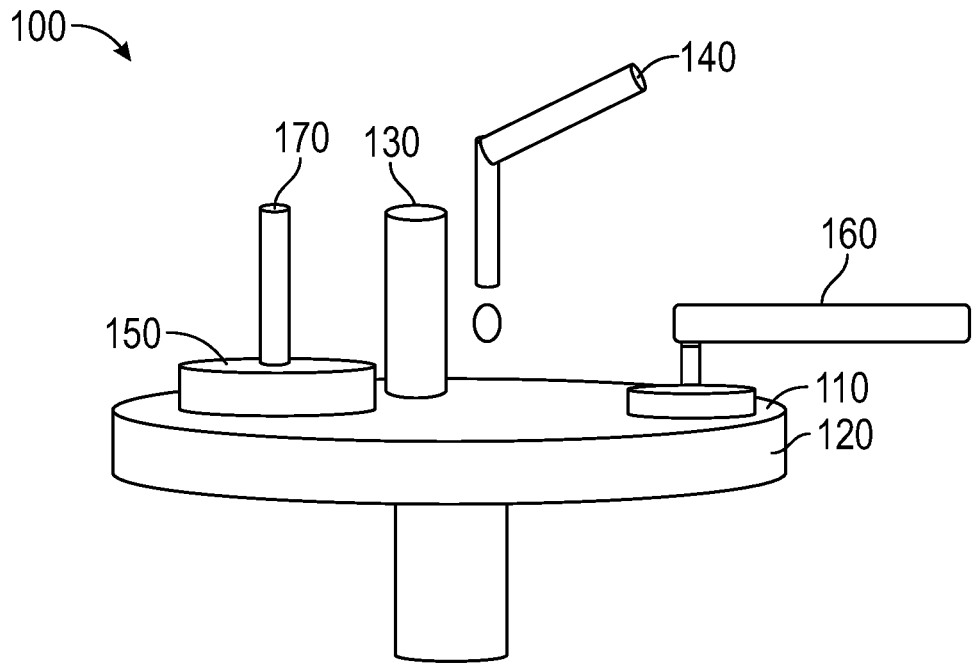
FIG. 1 is a schematic illustration of a chemical mechanical planarization system with a process improvement system, showing a wafer carrier holding a wafer in a processing position.

Detailed embodiments of the disclosed technology will now be described with reference to the drawings.

Introduction to Chemical Mechanical Polishing (CMP) Systems

The adoption and use of chemical mechanical polishing (CMP) for the planarization of thin films in the manufacture of semiconductor ICs, MEMS devices, and LEDs, among many other similar applications is common among all companies manufacturing "chips" for these types of devices. This adoption includes the manufacture of chips for mobile telephones, tablets and other portable devices, plus desktop and laptop computers. The growth in nanotechnology and micro-machining holds great promise for ever-widespread use and adaptation of digital devices in the medical field, in the automotive field, and in the Internet of Things (the "IoT"). Chemical mechanical polishing for the planarization of thin films was invented and developed in the early 1980s by scientists and engineers at the IBM Corporation. Today, this process is widespread on a global basis and is one of the truly enabling technologies in the manufacture of nearly all digital devices.

Integrated circuits are manufactured with multiple layers and alternating layers of conducting materials (copper, tungsten, aluminium, etc.), insulating layers (silicon dioxide, silicon nitride, etc.), and semiconducting material (polysilicon). A successive combination of these layers is sequentially applied to the wafer surface, but because of the implanted devices on the surface, topographical undulations are built up upon the device structures, as is the case with silicon dioxide insulator layers. These unwanted topographical undulations must be flattened or "planarized" before the next layer can be deposited. In the case of copper layers, the copper is deposited on the surface to fill contact vias and make effective vertical paths for the transfer of electrons from device to device and from layer to layer. This procedure continues with each layer that is applied (usually applied by a deposition process). In the case of multiple layers of conducting material (multiple layers of metal), this could result in numerous polishing procedures (one for each layer of conductor, insulator, and semiconductor material) in order to achieve successful circuitry.

The CMP process is an enabling technology in the manufacture of multi-layer circuitry that makes this all possible.

The major cost contributor in the CMP process is made up of the collective costs associated with the consumable set, specifically the polishing slurries and the polishing pads. Typical polishing slurries used in CMP processing comprise, for example, colloidal suspensions of abrasive particles (e.g., colloidal silica, colloidal alumina, colloidal ceria, etc.) suspended or contained within, for example, a water-based medium.

The polishing pads are typically polyurethane based. Additionally, the typical CMP polishing pad is usually from 18" to 24" in diameter; this dimension dictated by the size of the polishing platen (i.e., table) on the popular polishing machines in use around the world. However, in some applications (e.g., precision optical applications) they may be even larger in diameter (e.g., up to 48" or larger). These polishing pads are attached to a very flat polishing platen (i.e., polishing table) by pressure sensitive adhesive.

During the CMP process, a slurry is applied, via a metering pump or mass-flow-control regulator system, onto a rotating polishing pad. In addition, a substrate or wafer is held by a wafer carrier which is rotated and pressed against the polishing platen for a specified period of time. The term "substrate" and "wafer" are used interchangeably herein, and include, for example, semiconductor or silicon wafers, flat panel displays, glass plates or disks, plastic work-pieces, and other substantially rigid, flat and thin work-pieces of various shapes (e.g., round, square rectangular, etc.) and sizes on which one or more embodiments of the apparatuses and processes disclosed herein can be implemented. Additionally, a slurry may be brought to the polishing platen in, for example, a single-pass distribution system. The normal expectation is that the slurry particles in their media will be distributed evenly between the rotating wafer, and the rotating platen and/or polishing pad. It is quite typical, however, for much of the polishing slurry to not be effective or not be productive because it is swept to the edge of the polishing pad/platen by centrifugal force, and/or by "squeegee" action of the wafer against the polishing pad/platen. Thus, this portion of the polishing slurry may never reach the wafer surface, rendering that portion of slurry an inactive participant in the polishing activity. In some instances, the hydrophobic nature of the surface of the polishing pad contributes to the polishing slurry being swept aside easily and ultimately, swept into a waste drain.

A force is applied to the wafer (e.g., by a substrate carrier head, e.g., via a pressure applied to a membrane within a carrier head) to provide pressure between the wafer and the polishing pad, and thus, press the wafer into the pad for processing. In addition, the wafer and the pad both have motion to create a relative velocity. The motion and force leads to portions of the pad creating abrasion by pushing the abrasive particles or other abrasive against the wafer (i.e., substrate) while it moves across the wafer surface. The corrosive chemicals in the slurry alter the material being polished on the surface of the wafer. This mechanical effect of abrasion combined with chemical alteration is called chemical mechanical planarization or polishing (CMP). Accordingly, the removal rate of material from the substrate can be orders of magnitude higher due to both the chemical and mechanical effects simultaneously compared to either one (chemical or mechanical) taken alone. Similarly, the smoothness of the surface after polishing may also be optimized by using chemical and mechanical effects together.

Yield is the driving force in determining success at the manufacturing level for many products (e.g., integrated circuits, MEMS, LEDs, etc.). Accordingly, the accumulated cost of manufacturing a solid-state device is termed the "Cost-of-Ownership" (CoO) and this term is also applied to each of the required manufacturing steps. Ultimately, the CoO of the CMP process is one of the highest CoO figures in the 500 to 800 individual manufacturing steps required to make a semiconductor "chip" and its associated digital device.

Two of the challenges in the CMP process are the reduction of the optimal amount of polishing slurry needed per layer being polished and increasing the lifetime of the polishing pad and the polishing slurry. Another challenge is preventing slip or loss of a substrate from a carrier during polishing, which can damage the substrate and/or the equipment, which in turn can reduce yield and increase CoO.

For several years, various individuals and innovative companies have attempted to manufacture recycling systems for the polishing slurries. These systems have mostly been either off-line in nature (i.e., away from the polishing room) or in-line in nature (i.e., within the slurry distribution system at Point-of-Use (POU) positioned near each polishing machine). Four important factors to monitor and control for effective CMP polishing slurries are the pH of the slurry, the particle size of the abrasive component, the specific gravity of the slurry, and the cleanliness of the slurry.

As the slurry is distributed onto the polishing pad, environmental factors, such as evaporation, tend to change the fluid media content in the slurry. This change in content tends to affect the pH of the slurry, which, in turn, tends to negatively affect the specific gravity of the slurry. During the polishing process, material (e.g., copper, polysilicon, etc.) is removed from the surface of the wafer that creates microscopic particles. These microscopic particles either remain in suspension in the slurry, become embedded in the polishing pad or some combination of both. These microscopic particles cause scratches on the surface of the film being polished, and thus catastrophic failures in the circuitry.

These physical changes in the make-up of the polishing slurry, while perhaps not disastrous to certain lapping slurries or fine grind slurries in machine shops and precision optical manufacturing applications, can render the surfaces of semiconductor silicon wafers tragically, catastrophically, and/or permanently damaged. These scratches and failures can render a damaged chip useless, and thus negatively affect yield. For these and other reasons, slurry recycling/recirculation systems, while common in metal lapping applications and in some precision optical applications where surface quality tolerances are in microns, have not been particularly successful in the CMP process industry (e.g., within semiconductor fabs) or, for example, in foundries where surface quality tolerances are measured in nanometers and even Angstroms.

It is an object of the disclosed technology to address the many issues described above, with respect to substrate waste, yield and CoO, for example, through the utilization of an in-situ wafer slip detection system in the CMP process to provide increased CMP yields and an overall improvement in the CMP process.

FIG. 1 is a schematic illustration of a chemical mechanical planarization (CMP) system 100 including process improvement system 130 for improving the CMP process. System 100 can include a wafer carrier 150 configured to hold and process a wafer. In the illustrated embodiment, the wafer carrier 150 is in a processing (i.e., lowered) position, holding the wafer or substrate 155 (not shown in FIG. 1) against a polishing pad 110. The polishing pad 110 may be positioned on a supporting surface, such as a surface of a platen 120. In some embodiments, the platen 120 may be configured to raise upward to meet the components of system 100, such as the wafer carrier, the pad conditioning arm, the process improvement system, and the slurry delivery system.

Figure 2:
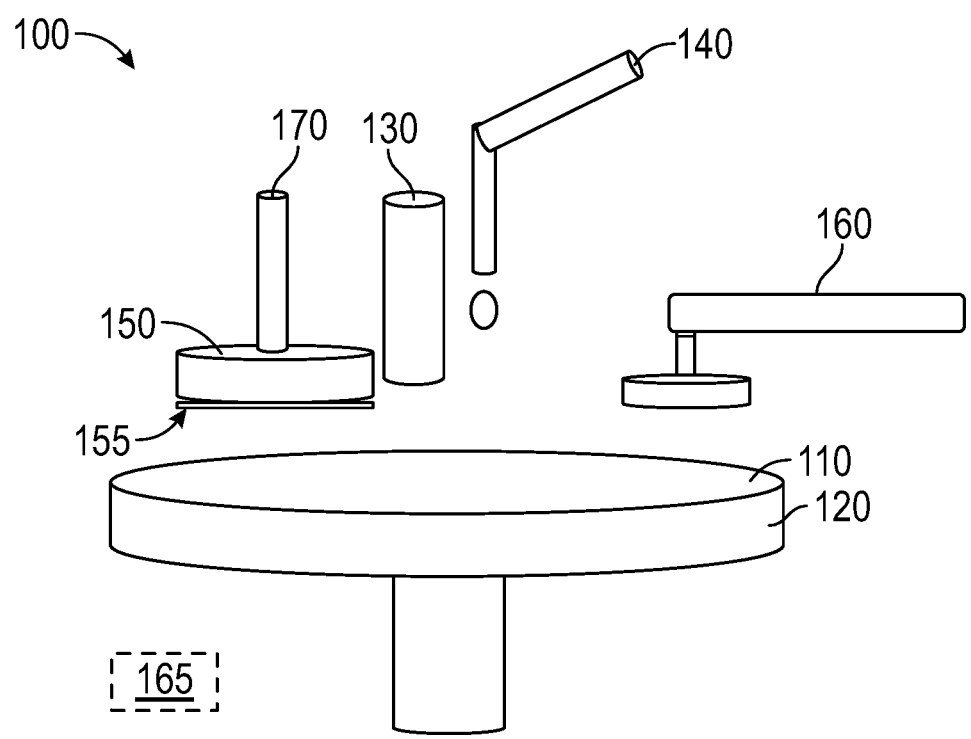
FIG. 2 is a view of the chemical mechanical planarization system of FIG. 1, showing the wafer carrier holding the wafer in a loading position.

FIG. 2 is a view of the chemical mechanical planarization system of FIG. 1, showing a wafer 155 held by the wafer carrier 150 in a loading (e.g., raised or upper) position. In some embodiments, the wafer 155 can be held, for example, by force of a vacuum. For example, the wafer carrier 150 can hold or attach wafer 155 with a vacuum system, so that the surface of the wafer 155 to be polished faces towards polishing pad 110 when attached to wafer carrier 150. Referring to both FIGS. 1 and 2, system 100 can include a slurry delivery system 140 configured to deliver a processing slurry to the wafer 155 and allow it to be chemically/mechanically planarized against polishing pad 110. System 100 can include a pad conditioning arm 160, which includes a pad conditioner at one end and can be configured to treat or "refresh" the surface roughness (or other processing characteristics of the pad) during or between processing cycles. System 100 can further include a controller 165 which can be configured to provide the functionality of the methods described herein, and additional functionality. In some implementations, the controller 165 may be configured to detect the occurrence of wafer loss or slippage insitu as described in the "Systems and Methods for Insitu Wafer Slip Detection" section below. Depending on the embodiment, the controller 165 may include a processor and a memory storing instructions configured to cause the processor to execute the methods described herein. For example, the controller 165 can be configured to communicate (e.g., electronically) with the process improvement systems (e.g., the slip detection systems) and/or the mechanical or electro-mechanical apparatus, and/or other CMP equipment components described herein, or other systems or components, to provide functionality thereto.

Referring to system 100 of FIGS. 1 and 2, polishing pad 110 is on the top surface of platen 120 which rotates about an axis. Other orientations and directions of movement can be implemented as a person of ordinary skill in the art would readily appreciate (e.g., counter clockwise about a vertical axis, clockwise, etc.). Platen 120 may be configured to rotate clockwise, counterclockwise, back and forth in a ratcheting motion, etc.

The process improvement system 130 can be mounted stationary relative to, and above the surface of the polishing pad 110, as shown in FIGS. 1 and 2, or can be mounted on a movable support structure, as described further herein. In some embodiments, the process improvement system 130 may be configured to lower such that process improvement system 130 is in closer proximity to the polishing pad 110. In some embodiments, the process improvement system 130 may be configured (e.g., to move or be stationary) such that process improvement system 130 is in closer proximity to the carrier 150. The process improvement system 130 can be oriented or otherwise configured in any way suitable to improve the CMP process described elsewhere herein (e.g., by measuring reflectance of the polishing pad during polishing, and avoid substrate slip). The process improvement system can provide process improvements during a wafer polishing process.

In an embodiment, the slurry delivery system 140 can deliver a slurry (e.g., a polishing slurry) to a surface of a treated polishing pad 110. The polishing slurry may include or contain sub-micron abrasive and corrosive particles. In a non-limiting example, the polishing slurry typically comprises colloidal suspensions of abrasive particles (e.g., colloidal silica, colloidal alumina, colloidal ceria, etc.). In some embodiments, the abrasive particles are suspended in a water-based medium or any other suitable medium. In various embodiments, the slurry delivery system 140 includes a metering pump, a mass-flow-control regulator system, or any other suitable fluid delivery components as a person of ordinary skill in the art would understand.

Accordingly, abrasive particles and corrosive chemicals in the slurry, deposited by the slurry delivery system 140 on the polishing pad 110, mechanically and chemically polish the wafer through abrasion and corrosion, respectively. As shown, the slurry delivery system 140 delivers a slurry that flows downward through the system and ultimately, onto polishing pad 110. In some embodiments, wafer carrier 150 and polishing pad 110 can move relative to each other in any number of different ways, to provide the polishing. For example, wafer carrier 150 can apply a downward force against the platen 120, such that the wafer 155 is pressed against the polishing pad 110, with abrasive particles and corrosive chemicals of the slurry between the wafer 155 and the polishing pad 110 providing chemical and mechanical polishing while polishing pad 110 and wafer carrier 150 move relative to each other. The relative motion between polishing pads and wafer carriers can be configured in various ways, as would be understood by a person of ordinary skill in the art, and either or both can be configured to oscillate, move linearly, and/or rotate, counter clockwise and/or clockwise relative to each other. The movement can be provided through various mechanical or electro-mechanical apparatus, such as motors, linear actuators, robots, encoders, gear boxes, transmissions, etc., and combinations thereof.

Pad conditioning arm 160 conditions the surface of polishing pad 110, by pressing against polishing pad 110 with a force, with relative movement therebetween, such as the relative motion described above with respect to the polishing pad and wafer carrier 155. The pad conditioning arm 160 in the illustrated embodiment can oscillate, with a pad conditioner at one end. In some embodiments, the pad conditioner is configured to rotate clockwise or counterclockwise, for example. In some embodiments, the pad conditioner contacts polishing pad 110 and may make contact as the pad conditioner rotates.

Figure 3:
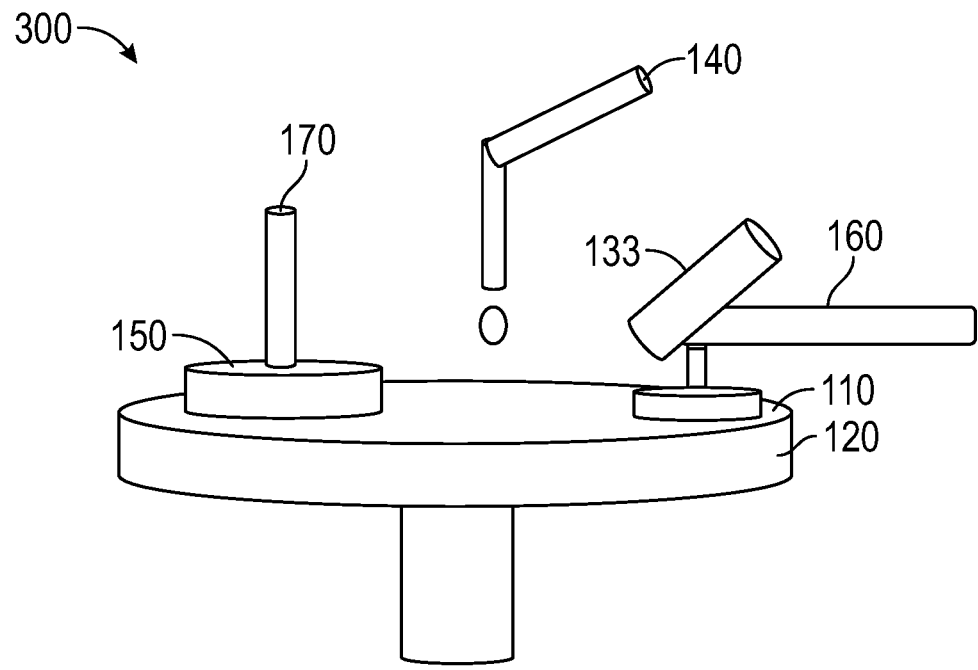
FIG. 3 is a schematic illustration of a chemical mechanical planarization system with a process improvement system attached to a movable support structure.

FIG. 3 is a schematic illustration of a chemical mechanical planarization system with a process improvement system 133 attached to a support structure. For example, the support structure may be moveable, such that it can provide variable positioning prior to, after, and/or during polishing. Process improvement system 133 can be mounted either on existing conditioning arms or alternatively, on a separate arm dedicated for positioning independent of the pad conditioner and the pad conditioners sweeping control mechanisms. For example, the process improvement system 133 can be attached to an arm or other support structure, such as pad conditioning arm 160 that moves, for example, or oscillates, to provide such movement functionality. System 300 of FIG. 3 includes polishing pad 110, platen 120, slurry delivery system 140, wafer carrier 150, wafer 155, and pad conditioning arm 160, as described above with respect to FIGS. 1 and 2. However, the system of FIG. 3 differs from the system of FIGS. 1 and 2 in that the process improvement 133 is mounted onto the pad conditioning arm 160, to enable variable positioning of the process improvement system and its interface, for example, with the polishing pad 110 prior to and/or during polishing. In various embodiments, the process improvement system 133 can be mounted on a different support structure, such as a separate arm (not shown), to allow independent positioning of the process improvement system 133 relative to the movement provided by the pad conditioning arm 160. For example, a process improvement system can be positioned and configured to allow it to interface with one or more locations, and/or components of a CMP system. For example, a process improvement system can be configured to interface with a surface of a wafer. A process improvement system can be configured to interface with two or more components of a CMP system, such as a wafer surface and/or a polishing pad surface. In another example, two or more process improvement systems can be implemented within the CMP systems described herein. For example, two process improvement systems may be included for each platen in a system where a system may have multiple platens for CMP processing.

Figure 4:
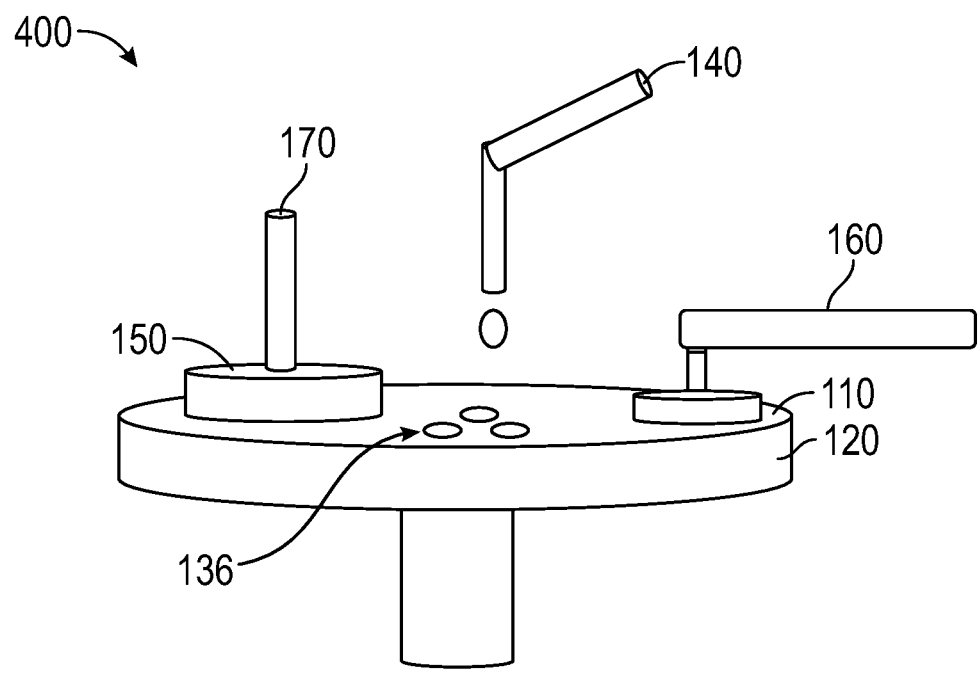
FIG. 4 is a schematic illustration of a chemical mechanical planarization system with a process improvement system embedded in a polishing pad to enable in-situ application of the improvement system process to or on the wafer surface.

FIG. 4 is a schematic illustration of a chemical mechanical planarization system 400 with one or more process improvement systems 136 embedded within another component of the system 400. For example, one or more process improvement system 136 can be embedded within a platen, wafer carrier, or within a polishing pad. In a non-limiting example, the process improvement system 136 may be positioned and assembled with respect to the polishing pad to allow at the process improvement system to interface with the polishing pad from within the polishing pad. Such embodiments can enable in-situ interaction between the process improvement system and, for example, the wafer surface. The system of FIG. 4 includes polishing pad 110, platen 120, slurry delivery system 140, wafer carrier 150, wafer 155, and pad conditioning arm 160, as described above with respect to FIGS. 1-3. However, the system of FIG. 4 differs from the system of FIGS. 1-3 in that the process improvement system 136 is embedded in the polishing pad 110.

Although FIGS. 1-4 illustrate aspects of a CMP apparatus (e.g., wafer carrier 150, wafer 155), a person of ordinary skill of art would understand that CMP machines can be assembled in any number of different ways. In addition, FIGS. 1-4 do not necessarily illustrate a complete CMP apparatus (which might otherwise include reference to a wafer carrier head membrane with a retaining ring surrounding it to receive pressure and hold a substrate, a body of a CMP apparatus, system for delivering wafer substrates to a particular CMP apparatus, etc.), but is merely meant to be an illustrative example to highlight the disclosed technology that is the subject of this disclosure. A person of ordinary skill in the art would understand that additional components of a CMP system (e.g., membrane, etc.) may be incorporated in the systems described herein. For example, wafer carrier head 150 may further comprise a vacuum system configured to secure a wafer against the membrane using vacuum pressure or suction. The resilient membrane can include one or more separate zones, with compressed gas applied to the top surface or back side of the membrane. Said pressure can be transmitted via the membrane to the top surface or back side of the wafer in order to effect the material removal during CMP. The wafer carrier head can include one or more rigid support components which provide means for fastening the membrane to its mating components, holding the membrane to its desired shape and dimension, and/or clamping the membrane to provide a sealed volume for sealing and containing the controlled gas pressure. Additionally, any of the apparatus and systems described herein can include a controller (e.g., controller 165, FIG. 2) which can be configured to provide the functionality of the methods described herein, and additional functionality. Furthermore, reference numeral 170 illustrates the relative location of a complete CMP apparatus (not shown) which would apply downward force to the wafer 150 attached to wafer carrier head 150 in polishing the wafer against a polishing pad fixed to a rotating platen. For example, the CMP apparatus would apply a downward force to a wafer carrier against polishing pad 110 to polish a wafer 155 when the wafer carrier is configured in a lowered position as shown in FIG. 1. Additionally, wafer carrier head 150 may comprise a membrane attached to the remaining body of the wafer carrier head 150. The membrane (not shown) can be configured to provide pressure between the wafer 155 and the polishing pad 110.

In addition, the CMP system, including the wafer carrier, the polishing platen, and/or the slurry distribution system, may be configured to be controlled by a control system 165 (FIG. 2). The control system may be configured to receive feedback from the CMP system and provide control signals to the CMP system. For example, the control system may be configured to provide variable distribution or variable speed functionality for the various components based on feedback signals received from the system. Accordingly, the system may adjust the rotational speeds of the wafer and the polishing platen during the CMP process in response to detecting the occurrence of wafer loss or slippage.

It will be understood that the process improvement systems, methods and equipment herein can be implemented without the full CMP systems shown in FIGS. 1-4. Additionally, other CMP equipment can implement the process improvement system features described herein, including multiple-head CMP systems, orbital CMP systems, or other CMP systems. For example, the process improvement systems, methods and equipment described herein can be implemented within sub-aperture CMP systems. A sub-aperture CMP system can include a polishing pad which is smaller in diameter than the wafer. The wafer is typically oriented face-up with slurry dispensed on its surface, while the wafer and polishing pad are rotated as the pad sweeps across the wafer.

For the CMP process, in-line adoption of the process improvement system will be suitable as a steady-state POU modification to existing legacy CMP planarization tools (polishing machines), and as a feature of new CMP planarization tools.

Systems and Methods for Insitu Wafer Slip Detection

The equipment described herein, such as that shown in FIGS. 1-4, or as described in other systems elsewhere herein generally, with respect to process improvement systems can be adapted to provide an improved method and apparatus for detecting the occurrence of wafer loss or slip during a work piece polishing process, such as CMP polishing. For example, an optical reflectance sensor or another type of optical sensor can be positioned to measure the reflectance of a portion of a wafer and/or the wafer carrier 150. For example, one or more sensors can be positioned on or within a portion of the carrier 150 to measure reflectance or other parameters of a backside of wafer 155 positioned within the carrier 150. One or more sensors can be positioned on or within a portion of the polishing pad 110 or platen 120 to measure reflectance or other parameters of the front side of wafer 155 positioned within the carrier 150. As will be described below, the reflectance value or other parameters received from the sensor can be used to detect the occurrence of wafer loss or slip during CMP.

Figure 5:
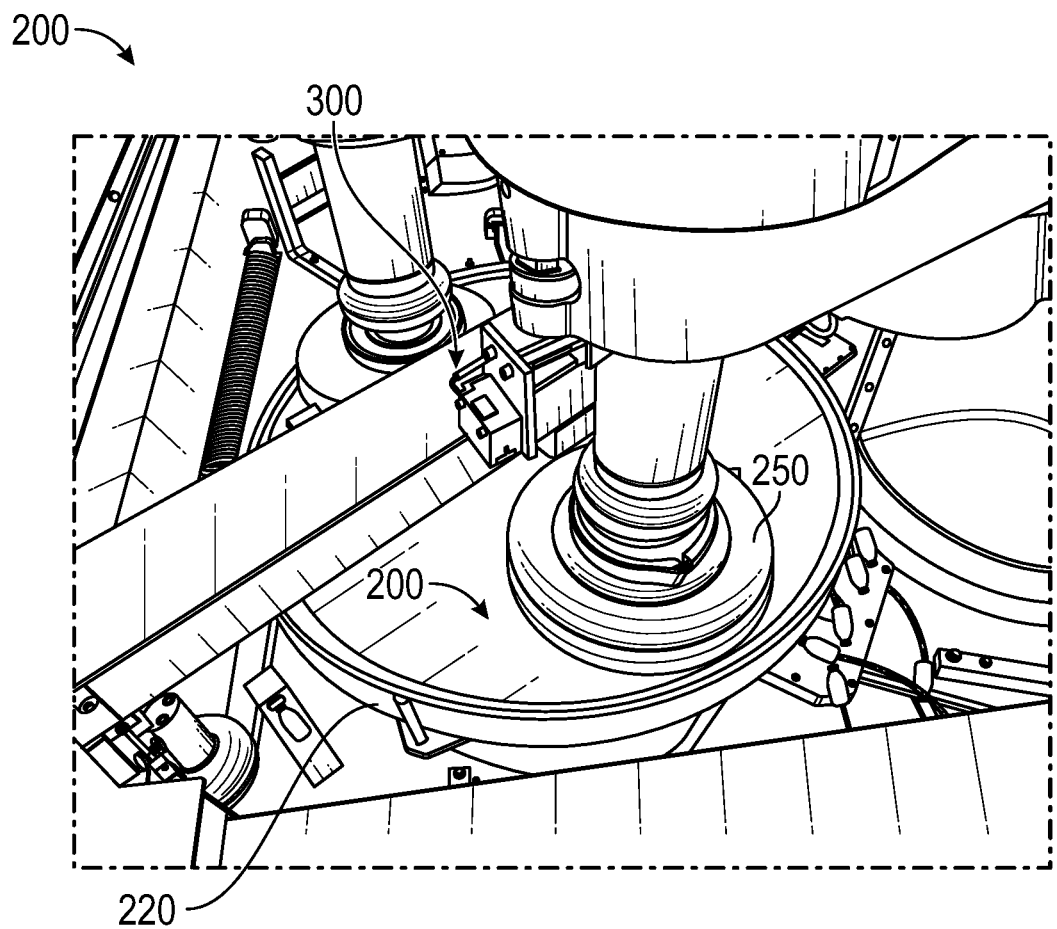
FIG. 5 is a view of an example CMP system including a slip sensor in accordance with aspects of this disclosure.

FIG. 5 is a view of an example CMP system 200 including a slip sensor in accordance with aspects of this disclosure. CMP system 200 can be similar to system 100 in FIGS. 1-4. For example, in certain implementations, the CMP system 200 includes a polishing pad 210 positioned on a platen 220, a wafer carrier 250 configured to hold a wafer or substrate (e.g., wafer 155 illustrated in FIG. 2) against the polishing pad 210 when in a processing (e.g., lowered) position, and a slip sensor 300. The slip sensor 300 can be connected to a system control unit (e.g., controller 165 illustrated in FIG. 2). In some implementations, the slip sensor 300 is connected via an intermediary device, such as: an IO-Link master Omron PLC card, a Beckhoff IO-Link master hub, etc. The slip sensor 300 can be mounted on a support structure or otherwise be implemented within system 200, as described generally with respect to process improvement system 130, 133 and 136 with respect to the CMP systems in FIGS. 1-4.

Figure 6:
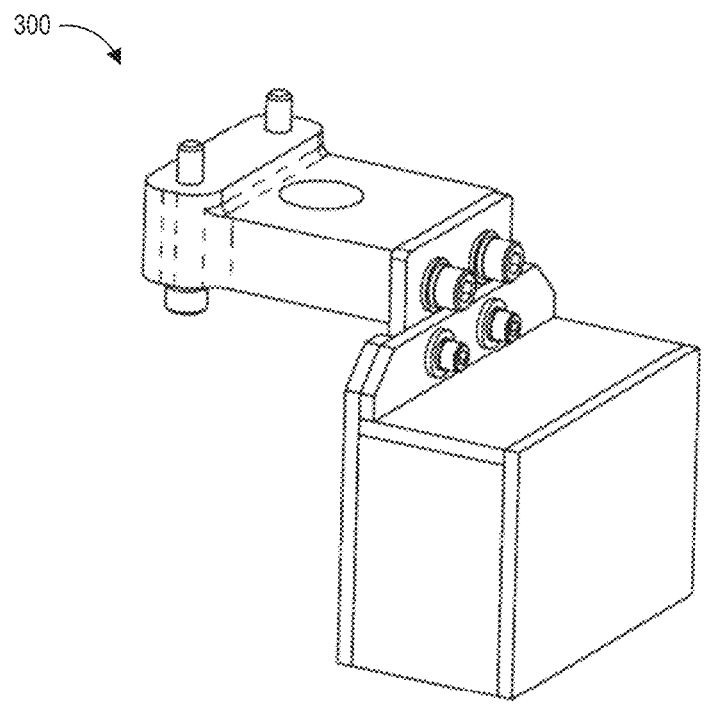
FIG. 6 is a schematic illustration of a slip sensor in accordance with aspects of this disclosure.
Figure 7:
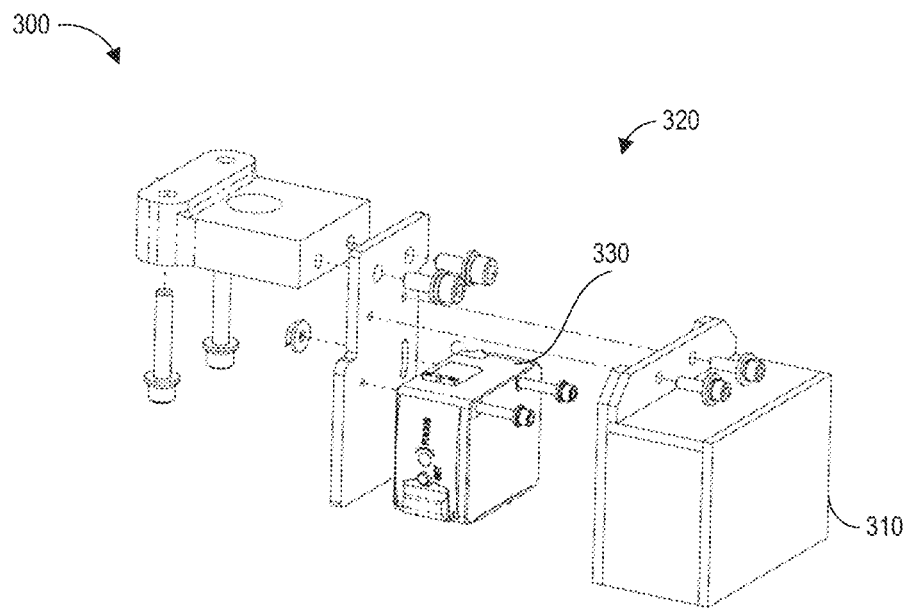
FIG. 7 is an exploded view of the slip sensor illustrated in FIG. 6.

FIG. 6 is a schematic illustration of a slip sensor 300 in accordance with aspects of this disclosure and FIG. 7 is an exploded view of the slip sensor 300 illustrated in FIG. 6. With reference to FIGS. 6 and 7, the slip sensor can include an optical sensor 310 configured to measure a reflectance within a field of view of the optical sensor 310, connecting hardware 320, and a switch 330. The connecting hardware can be used to connect the slip sensor 300 to the wafer carrier 250 as shown in FIG. 5.

The optical sensor 310 can be configured to detect wafer loss or slip by measuring the reflectance of the polishing pad 210 during polishing. The optical sensor 310 can communicate with a controller (e.g., controller 165—FIG. 2), and/or other firmware and software to provide the functionality herein.

Methods for detecting wafer loss or slip can rely on positioning an optical reflectance sensor positioned "downstream" of the wafer carrier that holds the wafer during polishing. Detecting a wafer that has slipped out of the carrier may be performed as outlined below and shown in FIG. 8. In particular, FIG. 8 is a flowchart illustrating an example method 1100 for detecting wafer loss or slip.

The method 1100 starts at block 1101. At block, 1102, the method 1100 involves measuring the reflectance of the polishing pad surface without a wafer. At block 1204, the method 1000 involves measuring the reflectance of the upward-facing surface of the wafer. At block 1106, the method 1100 involves setting a threshold value for the sensor 300 between the two reflectance values measured in blocks 1102 and 1104. In some implementations, the threshold value may be the midpoint between the two measured reflectance values. At block 1108, the method 1100 involves starting the wafer polishing process.

At block 1110, the method 1100 involves detecting whether the wafer has slipped out of the carrier during polishing based on the reflectance measured by the sensor 300. For example, the sensor 300 will detect a change in reflectance within its field of view, and provide a signal to the polisher control system as to whether the wafer has slipped out of the wafer carrier. In response to the reflectance crossing the threshold set in block 1106, the signal generated by the sensor 300 will indicate that the wafer has slipped out of the wafer carrier. At block 1112, the polisher control system will immediately stop all motion of the related components of the CMP system (e.g., motion of the polishing pad, platen, and wafer carrier) to prevent or minimize damage thereto, and/or to the wafer, in response to the signal received from the sensor 300 exceeding the threshold. If the reflectance measured by the sensor 300 does not cross the threshold, the sensor will continue measuring reflectance at block 1110 until the CMP process is completed. The method 1100 ends at block 1114.

Figure 8:
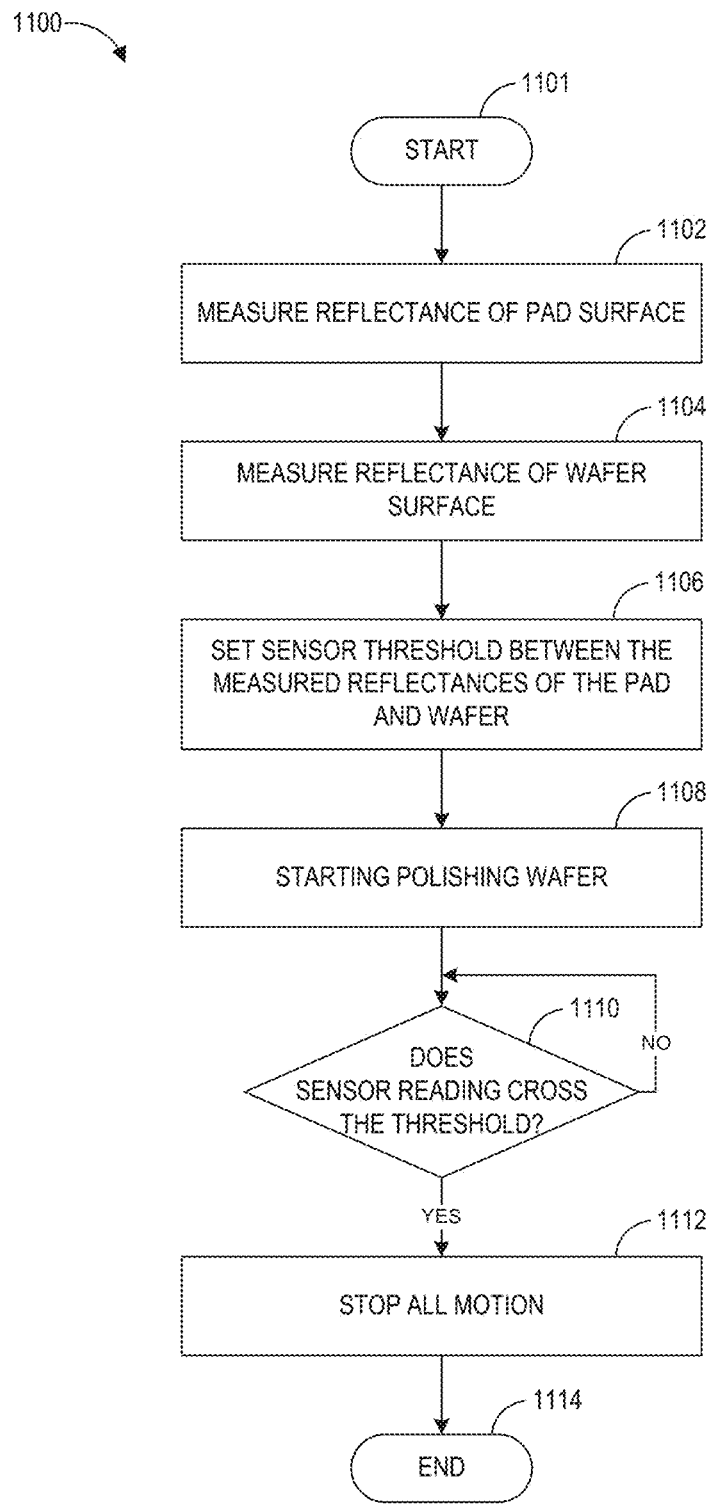
FIG. 8 is a flowchart illustrating an example method for detecting wafer loss or slip.

One possible drawback to the method of FIG. 8 is that the reflectance of the polishing pad can change over time due to several variables, including: the type of pad (e.g., the color, material, etc.), build-up of effluent on the polish pad surface resulting from the polishing process, the presence or absence of fluid on the pad surface such as water, chemicals and/or slurry, and/or a change in surface texture of the pad.

The reflectance of the wafer may also change over time due to other variables, including: different wafer materials, different films deposited on the wafer, different "upstream" processes applied to the wafer surface, such as oxidation, polishing, grinding, and etching, and/or the presence or absence of fluid residing on the wafer surface. Such upstream processes and variables can affect the sensor reflectance and the downstream slip detection accuracy.

Figure 9:
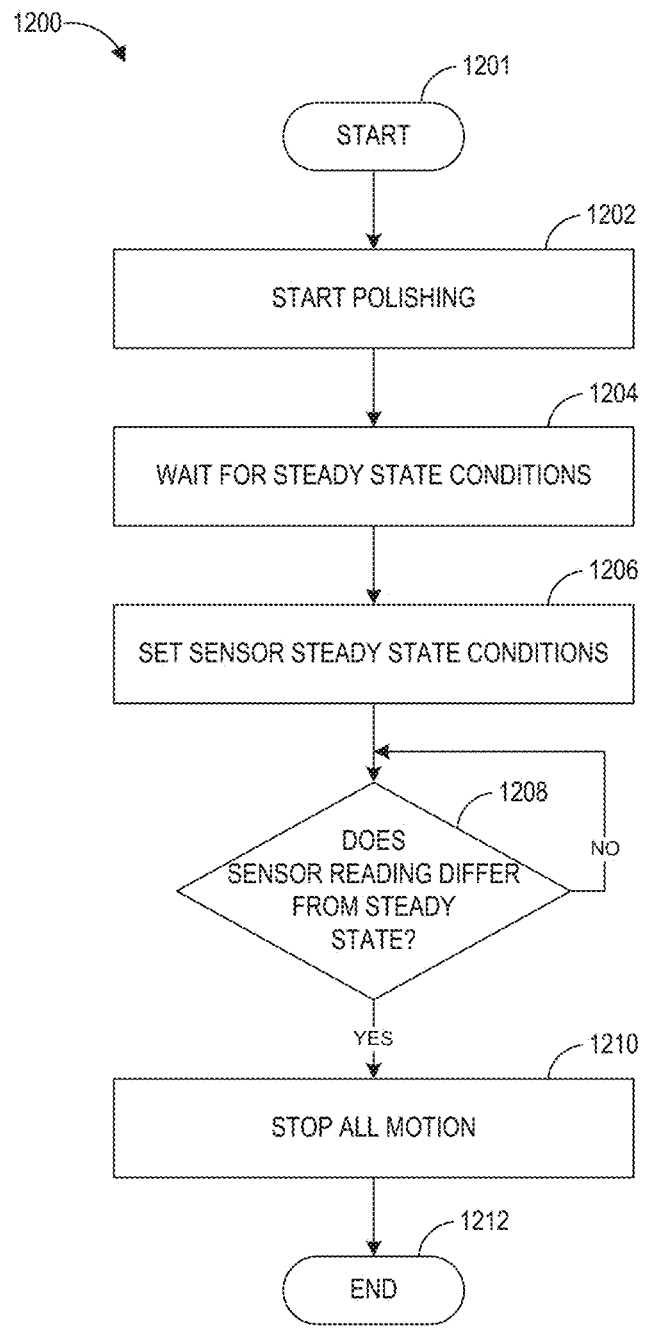
FIG. 9 is a flowchart illustrating another example method for detecting wafer loss or slip.

Due to these drawbacks, there is a need to provide a more reliable method for detecting a slipped wafer during polishing. In some embodiments, a more reliable method and apparatus for detecting wafer slippage can be done as follows and as shown in FIG. 9. In particular, FIG. 9 is a flowchart illustrating another example method 1200 for detecting wafer loss or slip.

The method 1200 starts at block 1201. At block, 1202, the method 1200 involves starting the polishing process, so that the field of view of the sensor 300 includes the conditions that substantially represent the steady-state condition realized during polishing. Such steady-state conditions can include: the actual pad 210 color, which may or may not change over the life of the pad, and from one pad to another; the presence or absence of any fluid(s) on the pad surface, such as slurry, water and/or chemical(s); and/or the pad surface texture.

At block 1204, the method 1200 involves waiting for steady-state conditions, which may be based on one or more of pad/platen rotation, wafer/carrier rotation, wafer and retaining ring pressure, and/or fluid flows, or any combination thereof. Once steady-state conditions are established, the method 1200 may continue at block 1206, in which the sensor 300 can be programmed or calibrated to the set of steady-state conditions. This can be done, for example, via a technology commercially referred to as "IO-Link," which enables reprogramming or recalibrating the background reference in real time.

At block 1208, the method 1200 involves the sensor 300 continuously measuring the conditions in the sensor's field of view during the remainder of the polishing process, and compare the output from the sensor 300 to the programmed or calibrated steady-state conditions determined in block 1206. If a wafer slips from the carrier during polishing, the conditions in the sensor's field of view will generally differ substantially from the programmed/calibrated condition, thus reliably detecting such a condition under various conditions and variables states. Thus, in response to the readings from the sensor 300 deviating from the steady state values (e.g., by more than a threshold value), the method 1200 proceeds to block 1210 at which all motion of the CMP system is stopped, to avoid substrate and/or equipment damage. If no deviation from the steady state value is detected, the method 1200 can stay at block 1208 until the CMP process is completed.

By executing the method 1200, the sensor 300 can provide a more reliable signal to the polisher control system, which can then immediately stop all motion at block 1210 to prevent or minimize damage to the wafer, polishing pad, carrier, etc. based on the signal received from the sensor. By providing a more reliable signal, the methods and systems described herein can prevent the false-detection of a slip due to changes in the polishing conditions which may occur before a steady-state is achieved, which may be a limitation to other traditional techniques.

Figure 10:
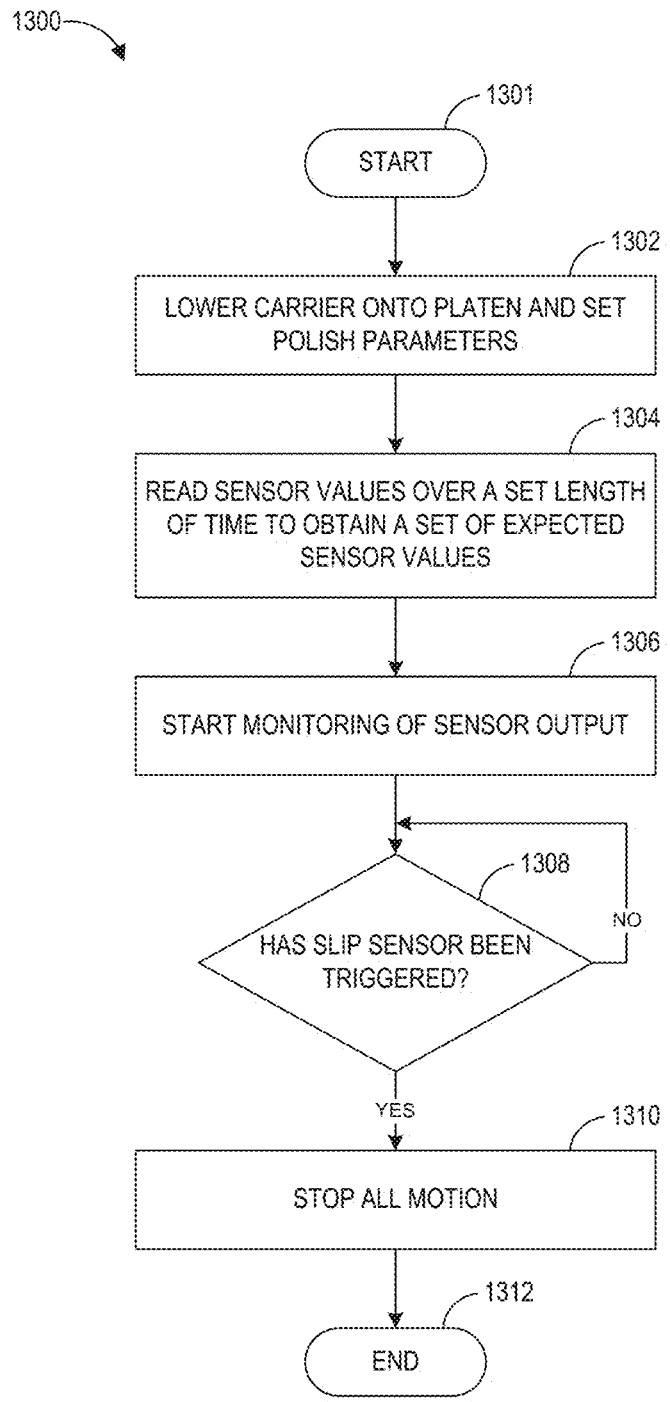
FIG. 10 is a flowchart illustrating yet another example method for detecting wafer loss or slip.

FIG. 10 is a flowchart illustrating yet another example method 1300 for detecting wafer loss or slip.

The method 1300 starts at block 1301. At block, 1302, the method 1300 involves lowering the carrier 250 onto the platen 220 and setting the polishing parameters to be used during the CMP polishing process. At block 1304, the method 1300 involves reading sensor values over a set length of time to obtain a set of expected sensor values. In some implementations, the set length of time may be about 5 seconds, however, in other embodiments, the set length of time may be longer or shorter. The set length of time may allow for the sensor to view each portion of the polishing pad that will be measured by the sensor during polishing. The expected sensor values may correspond to the range of color variation that the sensor can expect to read over the course of the CMP process. Thus, the system can "learn" the expected sensor values which can be used to detect wafer slippage.

At block 1306, the method 1300 involves starting monitoring of the sensor output. In some implementations, the monitoring of the sensor may start in response to beginning a polishing recipe. For example, the system may set a flag in software to start continuous monitoring of the sensor for wafer slip detection. The sensor values output from the sensor may be monitored to determine whether the wafer has slipped. At block 1308, the method 1300 involves determining whether the slip sensor has been triggered, for example, the system can compare the current sensor output to the expected sensor values obtained in block 1304. If the current sensor output does not differ from the expected sensor values by more than a threshold value, the system may determine that no wafer slip has occurred and the method 1300 may remain at block 1308. If the current sensor output differs from the expected sensor values by greater than the threshold value, the system may determine that the wafer has slipped and the method 1300 may continue to block 1310. At block 1310, the method 1300 involves stopping all motion to prevent damage to the CMP system and/or avoid wafer breakage. The method 1300 ends at block 1312.

Additionally, other CMP equipment can implement the wafer slip detection features described herein, including multiple-head CMP systems, orbital CMP systems, or other CMP systems.

Many variations and modifications may be made to the above-described embodiments, the elements of which are to be understood as being among other acceptable examples. All such modifications and variations are intended to be included herein within the scope of this disclosure. The foregoing description details certain embodiments. It will be appreciated, however, that no matter how detailed the foregoing appears in text, the systems and methods can be practiced in many ways. As is also stated above, it should be noted that the use of particular terminology when describing certain features or aspects of the systems and methods should not be taken to imply that the terminology is being re-defined herein to be restricted to including any specific characteristics of the features or aspects of the systems and methods with which that terminology is associated.

Conditional language, such as, among others, "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Conjunctive language such as the phrase "at least one of X, Y, and Z," or "at least one of X, Y, or Z," unless specifically stated otherwise, is to be understood with the context as used in general to convey that an item, term, etc. may be either X, Y, or Z, or a combination thereof. For example, the term "or" is used in its inclusive sense (and not in its exclusive sense) so that when used, for example, to connect a list of elements, the term "or" means one, some, or all of the elements in the list. Thus, such conjunctive language is not generally intended to imply that certain embodiments require at least one of X, at least one of Y, and at least one of Z to each be present.

The term "a" as used herein should be given an inclusive rather than exclusive interpretation. For example, unless specifically noted, the term "a" should not be understood to mean "exactly one" or "one and only one"; instead, the term "a" means "one or more" or "at least one," whether used in the claims or elsewhere in the specification and regardless of uses of quantifiers such as "at least one," "one or more," or "a plurality" elsewhere in the claims or specification.

The term "comprising" as used herein should be given an inclusive rather than exclusive interpretation. For example, a general-purpose computer comprising one or more processors should not be interpreted as excluding other computer components, and may possibly include such components as memory, input/output devices, and/or network interfaces, among others.

While the above detailed description has shown, described, and pointed out novel features as applied to various embodiments, it may be understood that various omissions, substitutions, and changes in the form and details of the devices or processes illustrated may be made without departing from the spirit of the disclosure. As may be recognized, certain embodiments of the disclosed technology described herein may be embodied within a form that does not provide all of the features and benefits set forth herein, as some features may be used or practiced separately from others. The scope of certain aspects of the technology disclosed herein is indicated by the appended claims rather than by the foregoing description. All changes which come within the meaning and range of equivalency of the claims are to be embraced within their scope.

What is claimed is:

1. A chemical mechanical planarization (CMP) system, comprising:
   a carrier configured to retain a substrate;
   a platen supporting a polishing pad;
   a slip sensor configured to generate a signal indicative of a characteristic of a surface of the polishing pad; and
   a processor configured to:
   start polishing the substrate,
   determine that the CMP system is in a steady-state condition that substantially represents a steady-state of the characteristic of the surface of the polishing pad experienced during polishing the substrate,
   receive a first signal from the slip sensor over a defined length of time in response to determining that the CMP system is in the steady-state condition,
   obtain a plurality of expected slip sensor values based on the first signal when the CMP system is in the steady-state condition,
   receive a second signal from the slip sensor during CMP polishing,
   compare the second signal received from the slip sensor to the expected slip sensor values, and
   detect wafer slip in response to the second signal received from the slip sensor during the CMP polishing differing from the expected slip sensor values by more than a threshold value.

2. The system of claim 1, wherein the slip sensor comprises an optical sensor configured to measure a reflectance of the surface of the polishing pad.

3. The system of claim 1, wherein the determination that the CMP system is in the steady-state condition is further based on at least one of the following: rotation of the platen, rotation of the carrier, a pressure applied to the substrate, a pressure applied to a retaining ring configured to hold the substrate within the carrier, and/or a rate of fluid flow provided onto the polishing pad.

4. The system of claim 1, wherein the processor is further configured to:
   stop all motion of components of the CMP system in response to detecting the wafer slip.

5. The system of claim 4, wherein stopping all motion of components of the CMP system in response to detecting the wafer slip comprising stopping motion of: the polishing pad, the platen, and/or the carrier.

6. The system of claim 1, wherein the defined length of time allows the slip sensor to measure each portion of the polishing pad that will be measured by the slip sensor during the CMP polishing.

7. The system of claim 1, wherein the steady-state of the characteristic of the surface of the polishing pad comprises a steady-state color of the surface of the polishing pad.

8. The system of claim 1, wherein the steady-state of the characteristic of the surface of the polishing pad comprises a steady-state of fluids present on the surface of the polishing pad.

9. The system of claim 1, wherein the steady-state of the characteristic of the surface of the polishing pad comprises a steady-state texture of the surface of the polishing pad.

10. A chemical mechanical planarization (CMP) system, comprising:
- a carrier configured to retain a substrate;
- a platen supporting a polishing pad;
- a slip sensor configured to generate a signal indicative of a characteristic of a surface of the polishing pad; and
- a processor configured to:
  - start polishing the substrate,
  - determine that the CMP system is in a steady-state condition that substantially represents a steady-state of the characteristic of the surface of the polishing pad experienced during polishing the substrate,
  - receive the signal from the slip sensor over a defined length of time in response to determining that the CMP system is in the steady-state condition,
  - obtain a set of expected sensor values based on the signal when the CMP system is in the steady-state condition,
  - compare the signal received from the slip sensor to the set of expected sensor values during CMP polishing, and
  - detect wafer slip in response to the signal received from the slip sensor during the CMP polishing differing from the set of expected sensor values by more than a threshold value.

11. The system of claim 10, wherein the slip sensor comprises an optical sensor configured to measure a reflectance of the surface of the polishing pad.

12. The system of claim 10, wherein the processor is further configured to:
- stop all motion of components of the CMP system in response to detecting the wafer slip.

13. The system of claim 10, wherein the set length of time allows the slip sensor to measure each portion of the polishing pad that will be measured by the slip sensor during the CMP polishing.

* * * * *